(12) United States Patent
Standley et al.

(10) Patent No.: US 9,019,002 B2
(45) Date of Patent: Apr. 28, 2015

(54) SELF-SCALED VOLTAGE BOOSTER

(71) Applicant: AltaSens, Inc., Westlake Village, CA (US)

(72) Inventors: David Lawrence Standley, Westlake Village, CA (US); Gaurang Natverbhai Patel, Newbury Park, CA (US)

(73) Assignee: AltaSens, Inc., Westlake Village, CA (US)

( * ) Notice: Subject to any disclaimer, the term of this patent is extended or adjusted under 35 U.S.C. 154(b) by 56 days.

(21) Appl. No.: 13/795,095

(22) Filed: Mar. 12, 2013

(65) Prior Publication Data

US 2013/0248687 A1    Sep. 26, 2013

Related U.S. Application Data

(63) Continuation of application No. 13/428,396, filed on Mar. 23, 2012, now Pat. No. 8,436,674.

(51) Int. Cl.
*H04N 5/357* (2011.01)
*G11C 5/14* (2006.01)

(52) U.S. Cl.
CPC ............... *H04N 5/357* (2013.01); *G11C 5/145* (2013.01)

(58) Field of Classification Search
CPC . H02M 3/07; H02M 3/073; H02M 2003/077; H02M 2001/009; G11C 5/145
See application file for complete search history.

(56) References Cited

U.S. PATENT DOCUMENTS

| 7,639,086 | B2 * | 12/2009 | Lee et al. ................. 331/1 A |
| 2009/0201280 | A1 | 8/2009 | Huang |
| 2011/0148509 | A1 * | 6/2011 | Pan ........................... 327/536 |
| 2011/0187443 | A1 | 8/2011 | Jin |
| 2012/0153910 | A1 * | 6/2012 | Bulzacchelli et al. ..... 323/272 |

OTHER PUBLICATIONS

Su, et al., "A Monolithic Step-Down SC Power Converter with Frequency-Programmable Subthreshold z-Domain DPWM Control for Ultra-Low Power Microsystems," Proc. 34th IEEE European Solid-State Circuits Conference (ESSCIRC), Sep. 15-19, 2008, pp. 58-61.
Hasan, et al., "A 5V Charge Pump in a Standard 1.8-V 0.18-micron CMOS Process," Proc. IEEE International Symposium on Circuits and Systems (ISCAS), May 23-26, 2005, vol. 2, pp. 1899-1902.

(Continued)

*Primary Examiner* — Sibin Chen
(74) *Attorney, Agent, or Firm* — Medley, Behrens & Lewis, LLC

(57) ABSTRACT

Various technologies described herein pertain to automatically adjusting the strength of a voltage booster of an image sensor. A self-scaled voltage booster includes a regulator, a controller, and two or more charge pumps that can be selectively enabled and disabled by the controller. The controller generates controller signals for the charge pumps based on a duty cycle of a regulator signal generated by the regulator. Moreover, the controller can maintain the controller signals without modification for at least a predetermined minimum period of time after a prior modification of at least one of the controller signals. Further, the controller can include a duty cycle and delay module (or a plurality of duty cycle and delay modules) that detects the duty cycle of the regulator signal and maintains the controller signals without modification for at least the predetermined minimum period of time.

26 Claims, 12 Drawing Sheets

(56) References Cited

OTHER PUBLICATIONS

Sidiropoulos, et al., "Adaptive Bandwidth DLLs and PLLs using Regulated Supply CMOS Buffers," Proc. IEEE Symposium on VLSI Circuits, 2000, pp. 124-127.

Liao, et al., "A Programmable Edge-Combining DLL With a Current-Splitting Charge Pump for Spur Suppression," IEEE Transactions on Circuits and Systems—II: Express Briefs, vol. 57, No. 12, Dec. 2010, pp. 946-950.

"Office Action dated Feb. 25, 2013", U.S. Appl. No. 13/428,396, Feb. 25, 2013, pp. 1-19.

"Reply to Office Action of Feb. 25, 2013", U.S. Appl. No. 13/428,396, Mar. 5, 2013, pp. 1-13.

* cited by examiner

SELF-SCALED VOLTAGE BOOSTER

CROSS-REFERENCE TO RELATED APPLICATION

This application is a continuation of U.S. patent application Ser. No. 13/428,396, filed on Mar. 23, 2012, and entitled "SELF-SCALED VOLTAGE BOOSTER", the entirety of which is incorporated herein by reference.

BACKGROUND

An image sensor is a device that can convert an optical image into an electronic signal. Image sensors are oftentimes utilized in still cameras, video cameras, video systems, and other imaging devices. Cameras and other imaging devices commonly employ either a charge-coupled device (CCD) image sensor or a complementary metal-oxide-semiconductor (CMOS) image sensor.

CMOS image sensors include an array of pixels, each of which can comprise a photodetector. CMOS image sensors also include circuitry to convert light energy to an analog voltage. Moreover, CMOS image sensors can include additional circuitry to convert the analog voltage to digital data. Thus, a CMOS image sensor can be an integrated circuit that comprises various analog, digital, mixed-signal, etc. components associated with capturing light and processing imaging related information; accordingly, a CMOS image sensor can be a system on chip (SoC). For example, components integrated into the CMOS image sensor oftentimes include a processor module (e.g., microprocessor, microcontroller, or digital signal processor (DSP) core), memory, analog interfaces (e.g., analog to digital converters, digital to analog converters), and so forth.

Visible imaging systems implemented using CMOS image sensors can reduce costs, power consumption, and noise while improving resolution. For instance, cameras can use CMOS image sensors that efficiently marry low-noise image detection and signal processing with multiple supporting blocks that can provide timing control, clock drivers, reference voltages, analog to digital conversion, digital to analog conversion, key signal processing elements, and the like. High-performance video cameras can thereby be assembled using a single CMOS integrated circuit supported by few components including a lens and a battery, for instance. Accordingly, by leveraging CMOS image sensors, camera size can be decreased and battery life can be increased. Also, dual-use cameras have emerged that can employ CMOS image sensors to alternately produce high-resolution still images or high definition (HD) video.

CMOS image sensors oftentimes include voltage boosters; thus, a voltage booster can be integrated as part of a CMOS image sensor system on chip. The voltage booster can generate a positive boosted output voltage that is above a supply voltage (e.g., above 3.3 V or any other supply voltage) and/or a negative boosted output voltage that is below ground (e.g., below 0 V). The voltage booster can be used to allow for high pixel performance at low supply voltages. According to an example, the voltage booster can generate a positive boosted output voltage, which can be used to drive transfer gates and/or reset gates of pixels in a pixel array of the CMOS image sensor to provide a wide dynamic range. By way of another example, the voltage booster can generate a negative boosted output voltage, which can be provided to transfer gates of pixels in the pixel array of the CMOS image sensor to reduce dark current.

Load capacitance on a voltage booster can vary considerably as a function of operating conditions. A voltage booster is typically designed to handle maximum loading with associated disturbance loads. However, when loading is less than the maximum loading, an output voltage (e.g., positive boosted output voltage or negative boosted output voltage) can include excessive ripple. Waveforms of output voltages that include excessive ripple can overshoot target voltage ranges for the output voltages, which can detrimentally impact performance of a CMOS image sensor.

A conventional approach for mitigating ripple in an output voltage waveform of a voltage booster includes employing a linear regulator in the voltage booster. However, linear regulators typically require power and occupy significant area on a chip. Yet, chips of common CMOS image sensors oftentimes lack sufficient area for linear regulators. Another common approach to reduce ripple in the output voltage waveform is to add ballast capacitance to the voltage booster. The ballast capacitance can increase a capacitance between an output node of the voltage booster and ground, which can reduce ripple under lower loading conditions. However, ballast capacitors can also occupy significant area on a chip, which may be unavailable.

SUMMARY

Described herein are various technologies that pertain to automatically adjusting the strength of a voltage booster of an image sensor. A self-scaled voltage booster includes a regulator, a controller, and two or more charge pumps that can be selectively enabled and disabled by the controller. The controller generates controller signals for the charge pumps based on a duty cycle of a regulator signal generated by the regulator. Moreover, the controller can maintain the controller signals without modification for at least a predetermined minimum period of time after a prior modification of at least one of the controller signals. Further, the controller can include a duty cycle and delay module (or a plurality of duty cycle and delay modules) that detects the duty cycle of the regulator signal and maintains the controller signals without modification for at least the predetermined minimum period of time.

In accordance with various embodiments, the two or more charge pumps can be selectively enabled and disabled to mitigate ripple in an output voltage generated by the self-scaled voltage booster. Hence, the controller can selectively enable and disable the charge pumps to account for load capacitance on the self-scaled voltage booster, which can be recognized from the duty cycle of the regulator signal. By way of example, the two or more charge pumps can have substantially similar strengths. Additionally or alternatively, at least two of the charge pumps can have different strengths. Moreover, the self-scaled voltage booster can include an auxiliary charge pump that can be permanently enabled; thus, the auxiliary charge pump can switch on or off responsive to the regulator signal.

In one or more embodiments, the controller can be a thermometer controller; yet, it is contemplated that the controller can be a different type of controller in other embodiments. Moreover, in various embodiments, the regulator can be a bang-bang regulator; however, the claimed subject matter is not so limited.

According to various embodiments, a system on chip can include a pixel array and the self-scaled voltage booster. Thus, the self-scaled voltage booster can provide an output voltage (e.g., positive boosted output voltage, negative boosted output voltage) to at least a subset of pixels of the pixel array.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
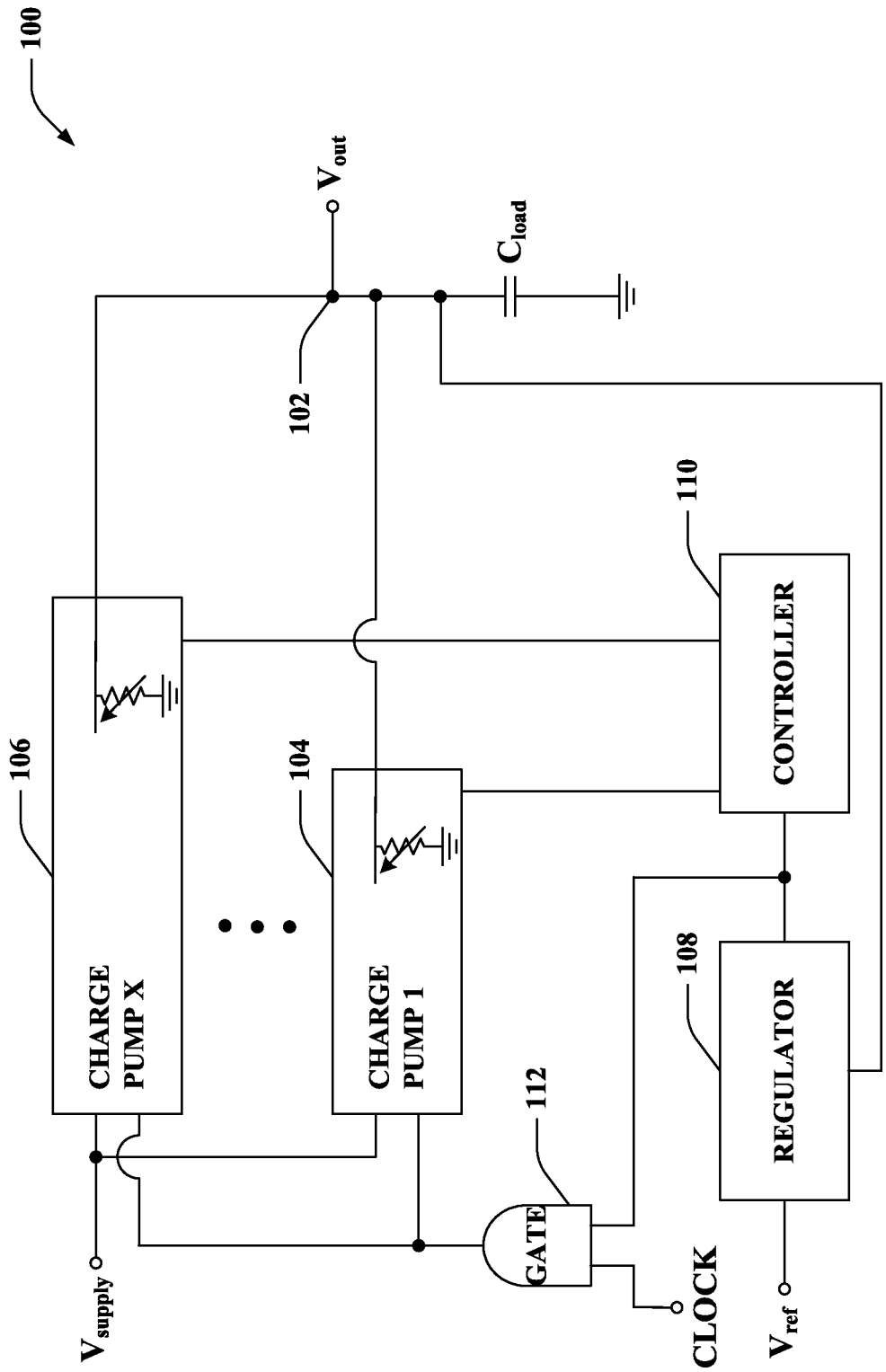
FIG. 1 illustrates a schematic diagram of an exemplary self-scaled voltage booster of an imaging system on chip.

Various technologies pertaining to automatically adjusting strength of a voltage booster of an image sensor are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As set forth herein, an image sensor can include a self-scaled voltage booster. The self-scaled voltage booster can include a regulator, a controller, and an array of charge pumps that can be selectively enabled and disabled by the controller. The controller can selectively enable and disable the charge pumps in the array based on a duty cycle of a regulator signal generated by the regulator. Moreover, the charge pumps from the array that are enabled can be switched on or off based on the regulator signal, while charge pumps from the array that are disabled remain off.

Referring now to the drawings, FIG. 1 illustrates an exemplary self-scaled voltage booster 100 of an imaging system on chip. The self-scaled voltage booster 100 includes an output node 102. The self-scaled voltage booster 100 can boost a supply voltage $V_{supply}$ to generate an output voltage $V_{out}$ at the output node 102; thus, the output voltage $V_{out}$ can be boosted above the supply voltage $V_{supply}$ (e.g., greater than 3.3 V or any other supply voltage) at the output node 102. While many of the examples set forth herein describe generation of a positive boosted output voltage, it is also contemplated that the self-scaled voltage booster 100 can generate a negative boosted output voltage $V_{out}$ at the output node 102 that is below ground (e.g., less than 0 V), and thus, the examples provided herein can be extended to such a scenario.

The self-scaled voltage booster 100 can have a load capacitance $C_{load}$ between the output node 102 and ground. The load capacitance $C_{load}$ can be capacitance associated with any loads on the self-scaled voltage booster 100 (e.g., pixel from a pixel array, row of pixels from a pixel array, a pixel array, etc.). According to an example, the load capacitance $C_{load}$ can also include other capacitances (e.g., ballast capacitances if space is available on the chip, routing capacitances, etc.); however, the claimed subject matter is not so limited.

The self-scaled voltage booster 100 includes an array of X charge pumps, namely, charge pump 1 104, . . . , and charge pump X 106 (collectively referred to as charge pumps 104-106), where X can be substantially any integer equal to or greater than two. The charge pump 1 104 can include an output terminal that is coupled with the output node 102, . . . , and the charge pump X 106 can include an output terminal that is coupled with the output node 102. According to an example, the charge pumps 104-106 in the array can have substantially equal strengths. By way of another example, the charge pumps 104-106 in the array can have differing strengths. Pursuant to yet a further example, a subset of the charge pumps 104-106 in the array can have substantially equal strengths, while at least one of the remaining charge pumps 104-106 in the array can have a strength that differs therefrom. Strength of a charge pump can correspond to an amount of charge in a packet supplied by the charge pump for a single clock cycle, which can relate to capacitance of capacitor(s) (not shown) included in the charge pump.

The supply voltage $V_{supply}$ can be provided to the charge pumps 104-106. According to an illustration, a charge pump (e.g., from the charge pumps 104-106) can absorb charge onto capacitors include therein (not shown). When the charge pump is switched on, the capacitors of the charge pump can be connected to the output node 102 of the self-scaled voltage booster 100; alternatively, when the charge pump is switched off, the capacitors of the charge pump can be disconnected from the output node 102. Thus, the capacitors of the charge pump can collect charge and thereafter supply such charge to the output node 102 in response to being switched on.

Moreover, the self-scaled voltage booster 100 includes a regulator 108. The regulator 108 includes an input terminal that is coupled with the output node 102, and can be configured to generate a regulator signal. The regulator 108 monitors the output voltage $V_{out}$ at the output node 102. The regulator 108 generates a regulator signal based on a comparison of a reference voltage $V_{ref}$ and the output voltage $V_{out}$ at the output node 102. For example, the regulator 108 can generate the regulator signal such that it is in a high state when the output voltage $V_{out}$ at the output node 102 is detected to be below the reference voltage $V_{ref}$ and in a low state when the output voltage $V_{out}$ is detected to be equal to or above the reference voltage $V_{ref}$. However, the claimed subject matter is not limited to the foregoing example. Further, an output terminal of the regulator 108 can output the regulator signal generated thereby.

The regulator 108 is not a linear regulator, since a linear regulator may require power and significant area on a chip. Instead, the regulator 108 can be a bang-bang regulator, for example. For instance, the regulator signal generated by a bang-bang regulator can be either in a high state or a low state (e.g., either on or off) at a given time. However, it is to be appreciated that other types of regulators are intended to fall within the scope of the hereto appended claims.

According to an example, the regulator 108 can receive the reference voltage $V_{ref}$ from an external source (not shown) (e.g., a source included in the self-scaled voltage booster 100 but external to the regulator 108, a source external to the self-scaled voltage booster 100, etc.). Alternatively, the regulator 108 can internally generate the reference voltage $V_{ref}$.

The self-scaled voltage booster 100 further includes a controller 110. The controller 110 includes an input terminal that is coupled with the output terminal of the regulator 108. Accordingly, the controller 110 can receive the regulator signal from the regulator 108. Further, the controller 110 can be configured to generate controller signals based at least in part on a duty cycle of the regulator signal; the controller signals can be outputted to the charge pumps 104-106. Hence, the controller 110 can be configured to selectively enable and disable the charge pumps 104-106 with respective controller signals.

By way of example, the controller 110 can be a thermometer controller. Following this example, the controller 110 can implement thermometer code. However, it is contemplated that other types of controllers are intended to fall within the scope of the hereto appended claims.

For example, the controller 110 can include an output terminal that is coupled with an input terminal of the charge pump 1 104, . . . , and an output terminal that is coupled with an input terminal of the charge pump X 106. By way of illustration, the controller 110 can generate a first controller signal, . . . , and an Xth controller signal. The first controller signal can be provided to the charge pump 1 104, . . . , and the Xth controller signal can be provided to the charge pump X 106. Moreover, the first controller signal can selectively enable and disable the charge pump 1 104, . . . , and the Xth controller signal can selectively enable and disable the charge pump X 106. However, in accordance with another example, it is contemplated that a common controller signal can be provided to the charge pumps 104-106.

Moreover, the controller 110 can include a duty cycle and delay module (not shown) (or a plurality of duty cycle and delay modules). The duty cycle and delay module can be configured to manage the controller signals based on the duty cycle of the regulator signal received from the regulator 108. Thus, the controller 110 (e.g., the duty cycle and delay module(s)) can detect the duty cycle of the regulator signal, and can generate the controller signals based on such duty cycle. For example, a high duty cycle of the regulator signal can indicate that currently enabled charge pump(s) from the array of charge pumps 104-106 are straining, and thus, one or more of the controller signals can be modified to enable a currently disabled charge pump from the array of charge pumps 104-106 in response to detecting the high duty cycle of the regulator signal. Alternatively, a low duty cycle of the regulator signal can indicate that currently enabled charge pumps from the array of charge pumps 104-106 are too strong, and thus, one or more of the controller signals can be modified to disable a currently enabled charge pump from the array of charge pumps 104-106 in response to detecting the low duty cycle of the regulator signal. Hence, the regulator signal can reflect a loading condition on the self-scaled voltage booster 100. Moreover, the duty cycle and delay module can be configured to maintain the controller signals without modification for at least a predetermined minimum period of time (e.g., subsequent to a modification of one or more of the controller signals). The duty cycle and delay module can allow the controller 110 to be autonomous when controlling the self-scaled voltage booster 100. Accordingly, the self-scaled voltage booster 100 need not have a separate clock or digital control for the controller 110, thereby allowing simple integration into an imaging system on chip.

When a charge pump (e.g., from the charge pumps 104-106) is enabled, the charge pump can be switched on or off responsive to the regulator signal from the regulator 108. Moreover, when the charge pump is disabled, the charge pump remains off (i.e., regardless of the regulator signal from the regulator 108). According to an example, the charge pump 1 104 can be enabled and the charge pump X 106 can be disabled during a given time period. Following this example, during the given time period, the charge pump 1 104 can be switched on or off responsive to the regulator signal from the regulator 108, while the charge pump X 106 can remain off. It is to be appreciated, however, that the claimed subject matter is not limited to the foregoing example.

Moreover, the self-scaled voltage booster 100 can include a gate 112. A clock signal can be provided to the gate 112. The gate 112 can also be coupled with the output terminal of the regulator 108; thus, the gate 112 can receive the regulator signal from the regulator 108. The gate 112 can combine the clock signal and the regulator signal to generate a gate signal, which can be inputted to the charge pumps 104-106. Hence, the gate signal can be a function of the regulator signal. Accordingly, the charge pumps 104-106 that are enabled can be switched on or off responsive to the gate signal, where the gate signal is based on the regulator signal; thus, the charge pumps 104-106 that are enabled can be switched on or off responsive to the regulator signal.

Figure 2:
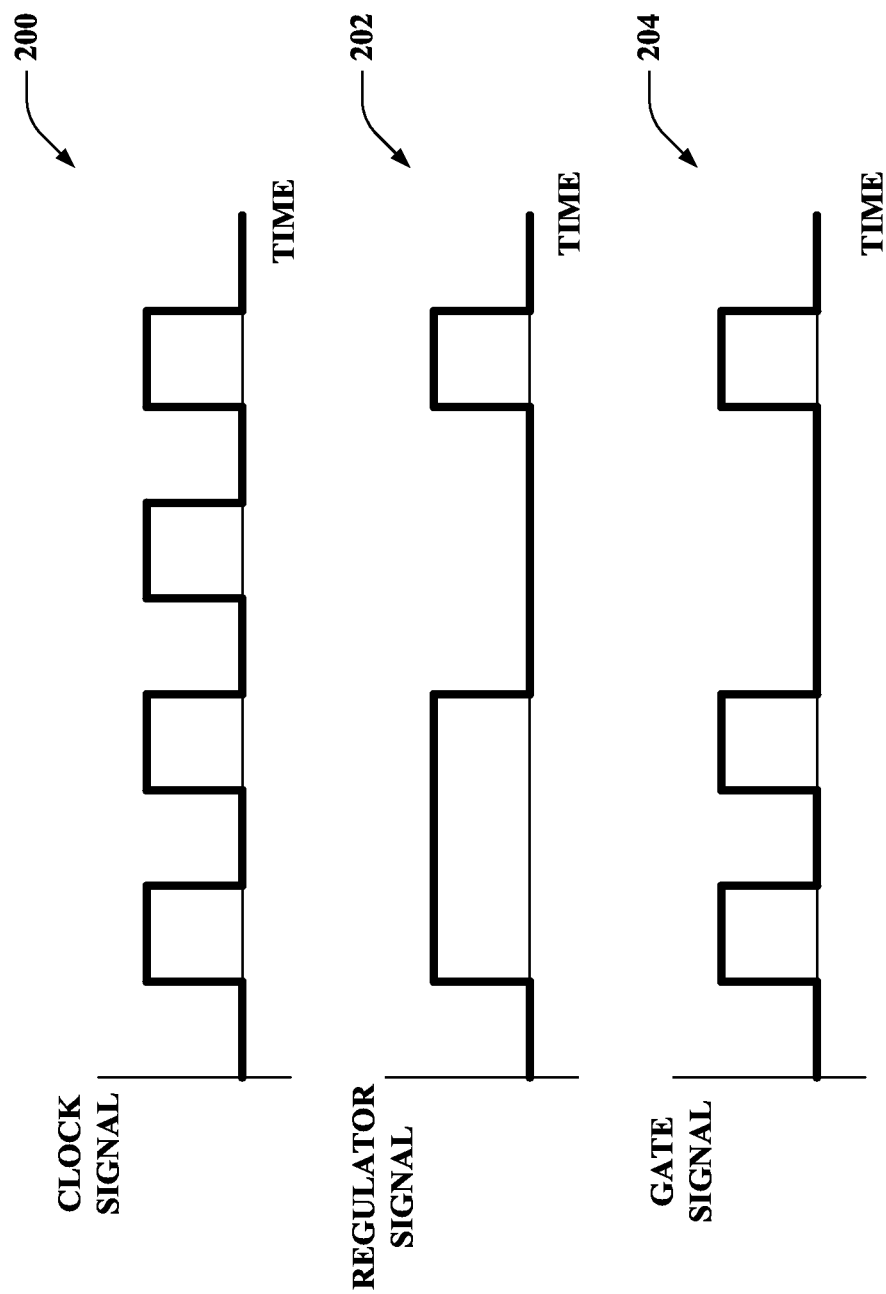
FIG. 2 illustrates exemplary signals provided to and generated by a gate of the self-scaled voltage booster of FIG. 1.

FIG. 2 illustrates exemplary signals provided to and generated by the gate 112 of the self-scaled voltage booster 100 of FIG. 1. More particularly, a clock signal 200 and a regulator signal 202 can be inputted to the gate 112. The clock signal 200, for example, can be a signal that oscillates between a high state and a low state. While the clock signal 200 is depicted as being a square wave with a 50% duty cycle and a fixed, constant frequency, it is contemplated that the claimed subject matter is not so limited. Moreover, the regulator signal 202 can be a signal that is in a high state when the regulator 108 detects that the output voltage $V_{out}$ at the output node 102 is below the reference voltage $V_{ref}$ and in a low state when the regulator 108 detects that the output voltage $V_{out}$ is equal to or above the reference voltage $V_{ref}$. Yet, the claimed subject matter is not so limited.

The gate 112 can be an AND gate, for example. Accordingly, the clock signal 200 and the regulator signal 202 can be combined by the gate 112 to generate a gate signal 204. Thus, the gate signal 204 can be an intermittent pulse stream. It is to be appreciated, however, that the claimed subject matter is not limited to the example depicted in FIG. 2.

Figure 3:
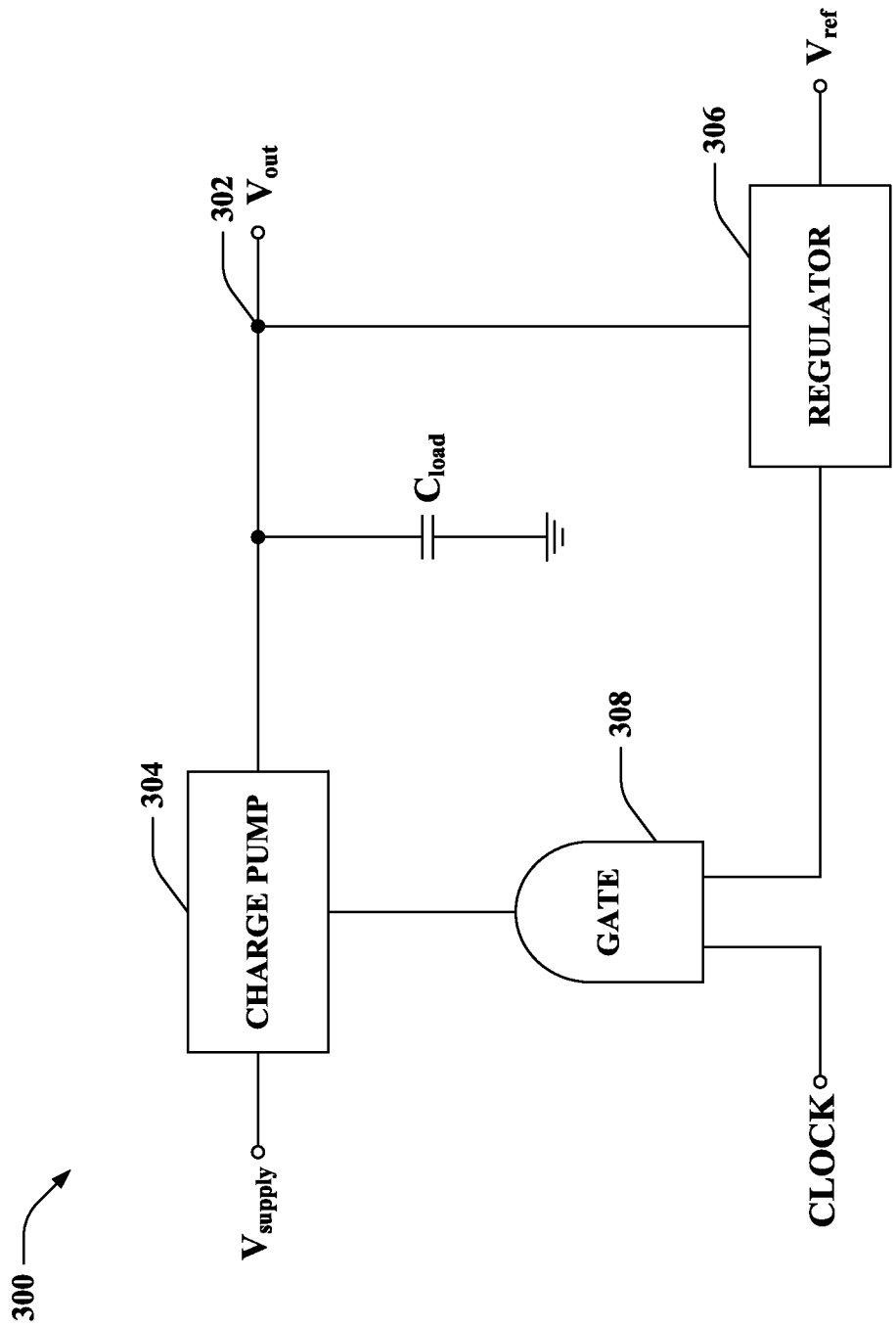
FIG. 3 illustrates a schematic diagram of a functional block diagram of an exemplary conventional voltage booster of an imaging system on chip.

Turning to FIG. 3, illustrated is an exemplary conventional voltage booster 300 of an imaging system on chip. The voltage booster 300 can include an output node 302. The voltage booster 300 can boost a supply voltage $V_{supply}$ to generate an output voltage $V_{out}$ at the output node 302. The voltage booster 300 further includes a charge pump 304, a regulator 306, and a gate 308. The regulator 306 can be similar to the regulator 108 of FIG. 1, and the gate 308 can be similar to the gate 112 of FIG. 1.

The charge pump 304 switches on or off responsive to a regulator signal generated by the regulator 306 (e.g., responsive to a gate signal based on the regulator signal). In contrast to the charge pumps 104-106 of FIG. 1, the charge pump 304 is not enabled or disabled by a controller. Thus, strength of the voltage booster 300 may be nonadjustable (e.g., the charge pump 304 remains enabled). Accordingly, a waveform of the output voltage $V_{out}$ at the output node 302 of the voltage booster 300 can include significant ripple, particularly when loading is low (e.g., low load capacitance $C_{load}$).

The voltage booster 300 can generate an output voltage waveform at the output node 302 that includes ripple. The ripple can depend on various design factors. A significant design factor that impacts the ripple is the load capacitance $C_{load}$. For instance, the load capacitance $C_{load}$ can change considerably between different operating conditions (e.g., pixels concurrently supplied with the output voltage $V_{out}$, integration period, etc.). According to an example, the voltage booster 300 can supply the output voltage $V_{out}$ to a single row of pixels in a pixel array under some operating conditions, while the voltage booster 300 can supply the output voltage $V_{out}$ to pixels in the entire pixel array under other operating conditions. Following the foregoing example, the load capacitance $C_{load}$ can significantly vary under the different operating conditions. However, it is contemplated that an amount of ripple can also depend on other factors.

The voltage booster 300 has a maximum load capacitance with associated disturbances that it is designed to handle. For instance, the disturbances can be coupling in the pixel array. However, when the load capacitance $C_{load}$ is less than the maximum load capacitance, the ripple in the output voltage $V_{out}$ generated by the voltage booster 300 can be excessive. The ripple can be proportional to a ratio of capacitance inside the charge pump 304 to the load capacitance $C_{load}$. Since the capacitance inside the charge pump 304 is fixed for the voltage booster 300 of FIG. 3 and the load capacitance $C_{load}$ varies, a voltage step $V_{step}$ can vary as a function of the load capacitance $C_{load}$. In contrast, in the self-scaled voltage booster 100 of FIG. 1, capacitance inside one or more of the charge pumps 104-106 that are enabled can vary over time (e.g., based on which of the charge pumps 104-106 are enabled), and thus, the foregoing ratio can be within a smaller range for the self-scaled voltage booster 100 as compared to the voltage booster 300.

Figure 4:
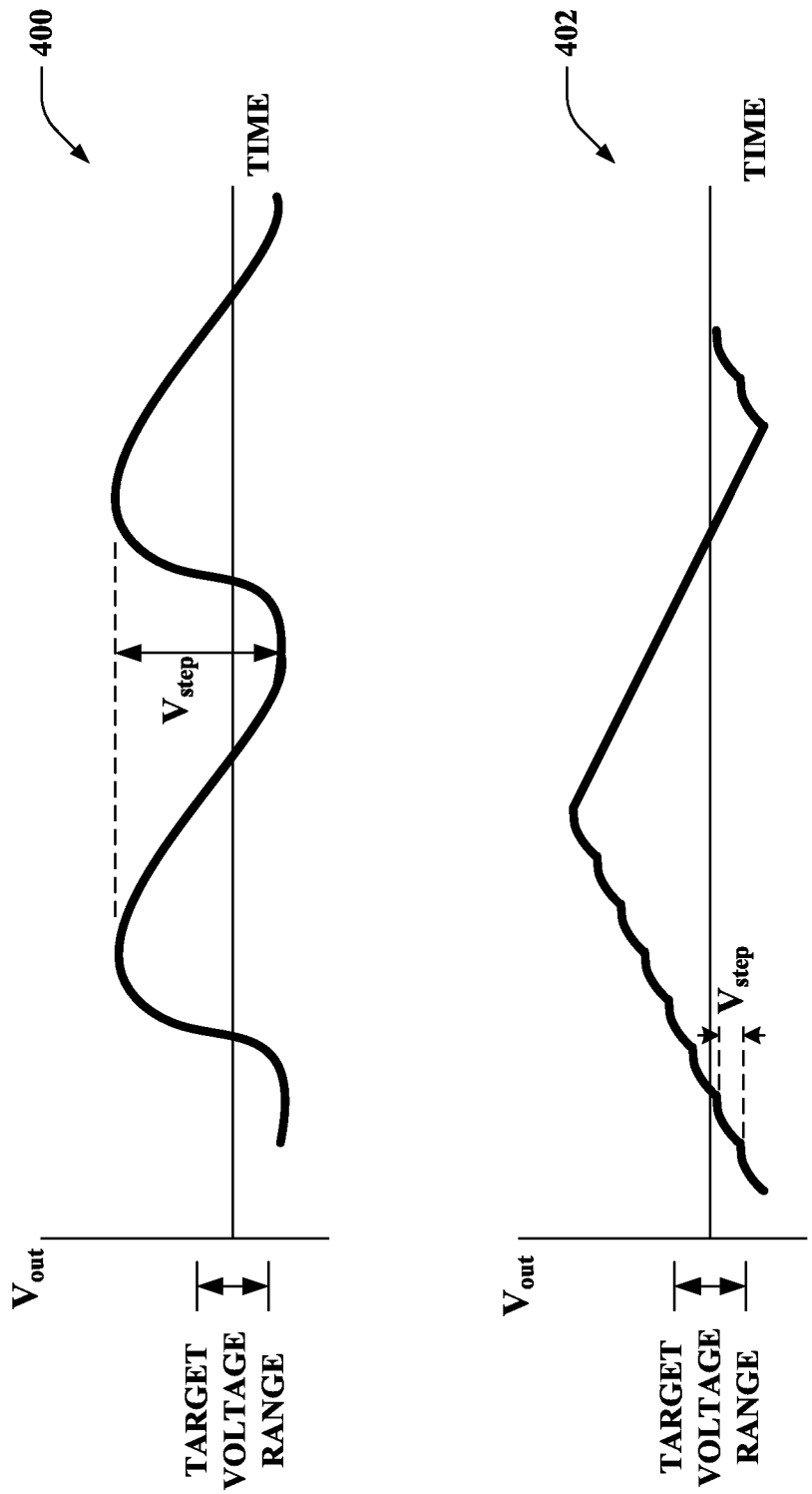
FIG. 4 illustrates exemplary output voltage ($V_{out}$) waveforms that include ripple that can be generated at an output node of the conventional voltage booster of FIG. 3 over time.

With reference to FIG. 4, illustrated are exemplary output voltage ($V_{out}$) waveforms that include ripple that can be generated at the output node 302 of the conventional voltage booster 300 of FIG. 3 over time. An output voltage waveform 400 depicts a step size that is too large, and an output voltage waveform 402 depicts a regulator delay that is too long. Moreover, target voltage ranges for the output voltage $V_{out}$ are illustrated.

As illustrated with the output voltage waveform 400, when the output voltage $V_{out}$ drops below the target voltage range, the regulator 306 can detect that the output voltage $V_{out}$ is below the reference voltage $V_{ref}$ and can generate a regulator signal that is at a high state. In response to the regulator signal, the charge pump 304 can provide a charge packet to the output node 302. However, the charge packet can be too large in the depicted example such that the voltage step $V_{step}$ causes the output voltage $V_{out}$ to overshoot the target voltage range. Thereafter, the output voltage $V_{out}$ can decay below the target voltage range, and a next charge packet can again cause the output voltage $V_{out}$ to overshoot the target voltage range, and the foregoing can repeat. Accordingly, ripple can be due to a single charge packet provided by the charge pump 304 that can cause the output voltage $V_{out}$ to overshoot the target voltage range in the exemplary output voltage waveform 400.

By way of another illustration, ripple can be caused by the delay of the regulator 306. As shown in the output voltage waveform 402, a voltage step $V_{step}$ (or a plurality of voltage steps) can be sufficient to raise the output voltage $V_{out}$ into the target voltage range. However, the charge pump 304 may continue to provide charge packets while the regulator 306 continues to generate a regulator signal that is at a high state such that the output voltage $V_{out}$ overshoots the target voltage range. Thus, depending on various parameters, the regulator 306 may take too long to respond to switch off the charge pump 304.

In contrast to the conventional voltage booster 300, the self-scaled voltage booster 100 of FIG. 1 can reduce the foregoing types of ripple by including an array of charge pumps 104-106 that can be selectively enabled and disabled by the controller 110. The self-scaled voltage booster 100 can automatically scale a size of a charge packet provided to the output node 102 based on a duty cycle of the regulator signal. For example, when the load capacitance $C_{load}$ is less than the maximum load capacitance for the self-scaled voltage booster 100, a subset of the charge pumps 104-106 can be enabled to provide a charge packet that is smaller than a maximum charge packet that can be provided when all of the charge pumps 104-106 are enabled, thereby controlling the voltage step $V_{step}$.

Again, reference is made to FIG. 1. As noted above, the controller 110 can be a thermometer controller (e.g., the controller 110 can provide a thermometer code), which can operate in accordance with the following example. According to such example, the self-scaled voltage booster 100 can include two charge pumps 104-106 (e.g., X can be two): a first charge pump and a second charge pump. Following this example, the controller 110 can be configured to selectively enable and disable the second charge pump only when the first charge pump is enabled; otherwise, when the first charge pump is disabled, the second charge pump is disabled. Moreover, the controller 110 can be configured to selectively enable and disable the first charge pump only when the second charge pump is disabled; otherwise, when the second charge pump is enabled, the first charge pump is enabled. In accordance with the above example, the first charge pump can be configured to switch on or off based on the regulator signal when enabled and remain off when disabled, and the second charge pump can be configured to switch on or off based on the regulator signal when enabled and remain off when disabled. It is to be appreciated that the foregoing example can be extended to a scenario where the self-scaled voltage booster 100 includes more than two charge pumps 104-106. It is further contemplated, however, that the claimed subject matter is not limited to the controller 110 being a thermometer controller, as other types of controllers are intended to fall within the scope of the hereto appended claims.

Moreover, the charge pumps 104-106 can each include a bleeder resistor to provide a direct current load (e.g., to decay the output voltage $V_{out}$). Thus, the charge pump 1 104 can include a first bleeder resistor, . . . , and the charge pump X 106 can include an Xth bleeder resistor. Resistances of the bleeder resistors included in each of the charge pumps 104-106 can be appropriately scaled with respective strengths of the charge pumps 104-106. Hence, according to an example where the charge pump 1 104 and the charge pump X 106 have differing strengths, a resistance of the first bleeder resistor included in the charge pump 1 104 can differ from a resistance of the Xth bleeder resistor included in the charge pump X 106.

As described above, the regulator signal generated by the regulator 108 can reflect a loading condition (e.g., the load capacitance $C_{load}$) on the output node 102. With no disturbance, the self-scaled voltage booster 100 can settle into a lowest drive state with limited ripple, even at low load capacitance $C_{load}$. It is to be appreciated that a state lacking disturbance may exist during a portion of a time period when the self-scaled voltage booster 100 is employed, yet it is a state that the self-scaled voltage booster 100 can be designed to handle (e.g., a stronger charge pump with a bleeder resistor having a smaller resistance can be automatically disabled compared to a weaker charge pump with a bleeder resistor having a larger resistance if both charge pumps are enabled and the regulator signal has a duty cycle below a threshold). Moreover, the bleeder resistor value in each of the charge pumps 104-106 can be modulated by the corresponding controller signal; when a charge pump (e.g., one of the charge pumps 104-106) is disabled, the resistance goes to a substantially higher or infinite value, instead of its designed value when that charge pump is enabled.

Figure 5:
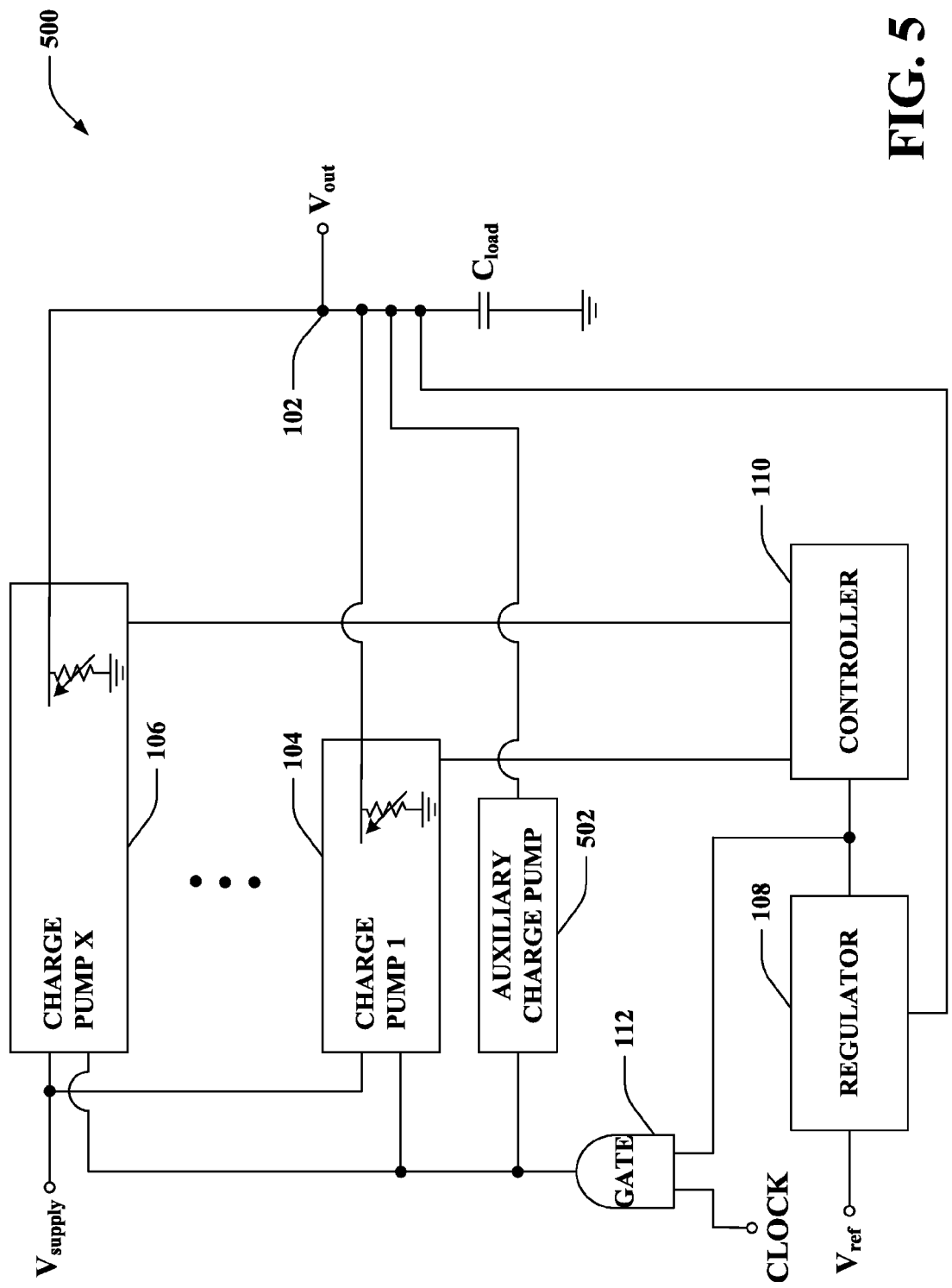
FIG. 5 illustrates a schematic diagram of another exemplary self-scaled voltage booster of an imaging system on chip.

Now referring to FIG. 5, illustrated is another exemplary self-scaled voltage booster 500 (e.g., the self-scaled voltage booster 100 of FIG. 1) of an imaging system on chip. The self-scaled voltage booster 500 includes the output node 102, the charge pumps 104-106, the regulator 108, the controller 110, and the gate 112. Moreover, the self-scaled voltage booster 500 includes an auxiliary charge pump 502.

The auxiliary charge pump 502 can include an output terminal that is coupled with the output node 102. Further, the auxiliary charge pump 502 can be configured to switch on or off based on the regulator signal from the regulator 108 (e.g., responsive to the gate signal from the gate 112 which is based on the regulator signal). More particularly, the auxiliary charge pump 502 can be permanently enabled; thus, the auxiliary charge pump 502 can be independent of the controller 110 while switching on or off in response to the regulator signal. Moreover, although not shown, it is contemplated that the auxiliary charge pump 502 can include a bleeder resistor; yet, the claimed subject matter is not so limited.

According to an example, the auxiliary charge pump 502 can have substantially similar strength to one or more of the charge pumps 104-106. By way of another example, the auxiliary charge pump 502 can have weaker strength than the charge pumps 104-106. It is to be appreciated, however, that the claimed subject matter is not limited to the above noted examples.

Figure 6:
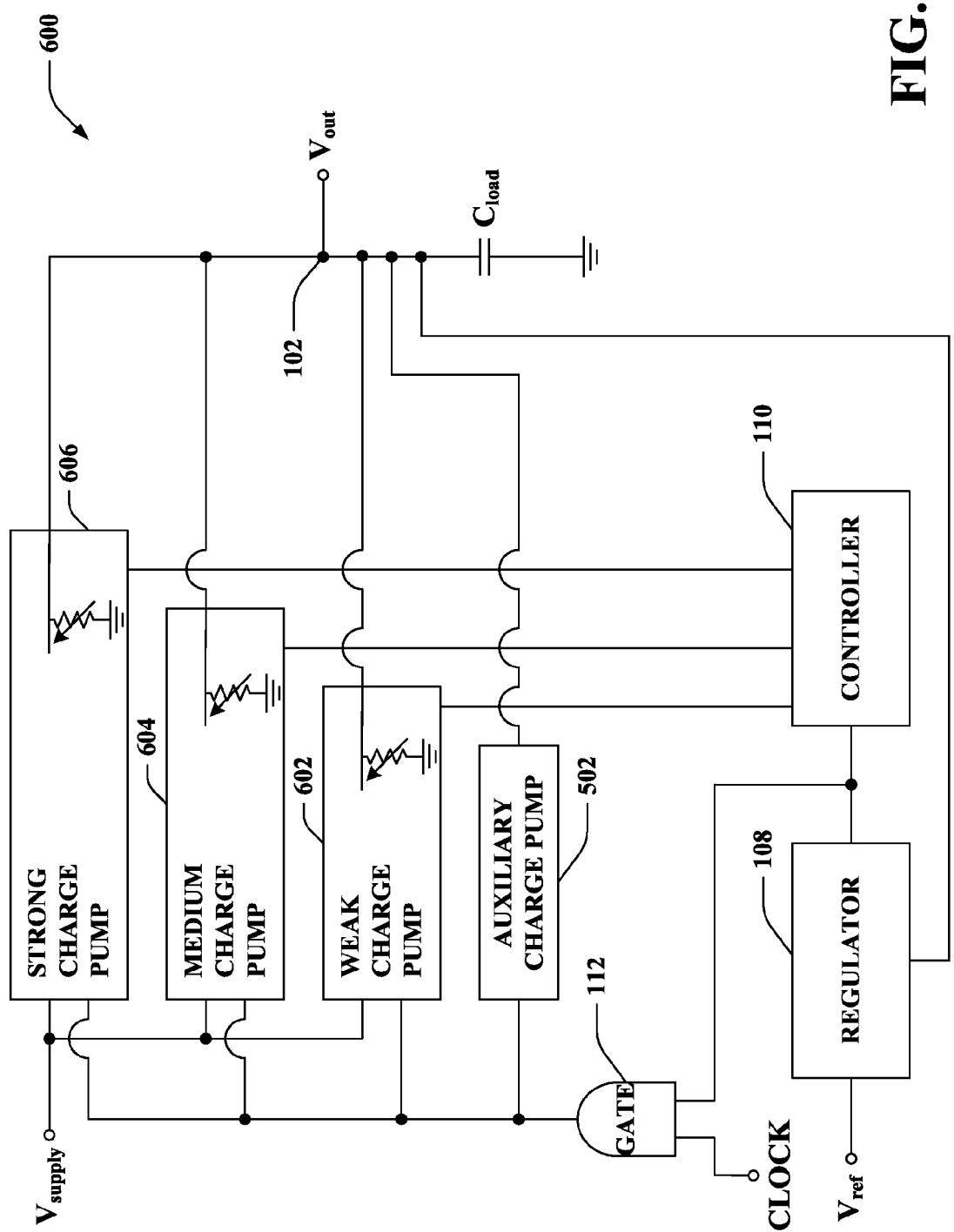
FIG. 6 illustrates a schematic diagram of an exemplary self-scaled voltage booster that includes an array of charge pumps of varying strengths.

Turning to FIG. 6, illustrated is an exemplary self-scaled voltage booster 600 (e.g., the self-scaled voltage booster 100 of FIG. 1) that includes an array of charge pumps of varying strengths. The self-scaled voltage booster 600 includes a weak charge pump 602, a medium charge pump 604, and a strong charge pump 606 (collectively referred to as charge pumps 602-606), each of which can be coupled with the output node 102. Moreover, the self-scaled voltage booster 600 can include the regulator 108, the controller 110, the gate 112, and the auxiliary charge pump 502.

The regulator 108 can be configured to generate a regulator signal based on a comparison of the reference voltage $V_{ref}$ and the output voltage $V_{out}$ at the output node 102. Further, the controller 110 can be configured to generate a first controller signal that selectively enables and disables the weak charge pump 602, a second controller signal that selectively enables and disables the medium charge pump 604, and a third controller signal that selectively enables and disables the strong charge pump 606. Such controller signals can be generated by the controller 110 based at least in part on a duty cycle of the regulator signal. The controller 110 can further be configured to inhibit modification of the first controller signal, the second controller signal, and the third controller signal for a predetermined minimum period of time after a prior modification of at least one of the first controller signal, the second controller signal, or the third controller signal. Moreover, the weak charge pump 602, the medium charge pump 604, and the strong charge pump 606 can be configured to switch on or off responsive to the regulator signal from the regulator 108 when respectively enabled; alternatively, when disabled, the weak charge pump 602, the medium charge pump 604, and the strong charge pump 606 can be configured to remain off.

According to an example described herein, the controller 110 can be a thermometer controller. Following this example, during a particular time period, the controller 110 can enable none of the charge pumps 602-606, the weak charge pump 602, the weak charge pump 602 and the medium charge pump 604, or all three of the charge pumps 602-606. Yet, it is to be appreciated that the claimed subject matter is not so limited.

Various relative strengths between the charge pumps 602-606 are intended to fall within the scope of the hereto appended claims. For example, a ratio of a strength of the medium charge pump 604 to a strength of the weak charge pump 602 may be in a range from two to ten (e.g., five, etc.). Similarly, a ratio of a strength of the strong charge pump 606 to a strength of the medium charge pump 604 may be in a range from two to ten (e.g., five, etc.). It is to be appreciated that the foregoing ratios can be substantially similar or different. It is contemplated, however, that ratios outside the foregoing ranges are intended to fall within the scope of the hereto appended claims. By way of further example, it is contemplated that higher ratios can be employed if the self-scaled voltage booster 600 includes ballast capacitance between the output node 102 and ground (e.g., occupying a small area on the chip).

Figure 7:
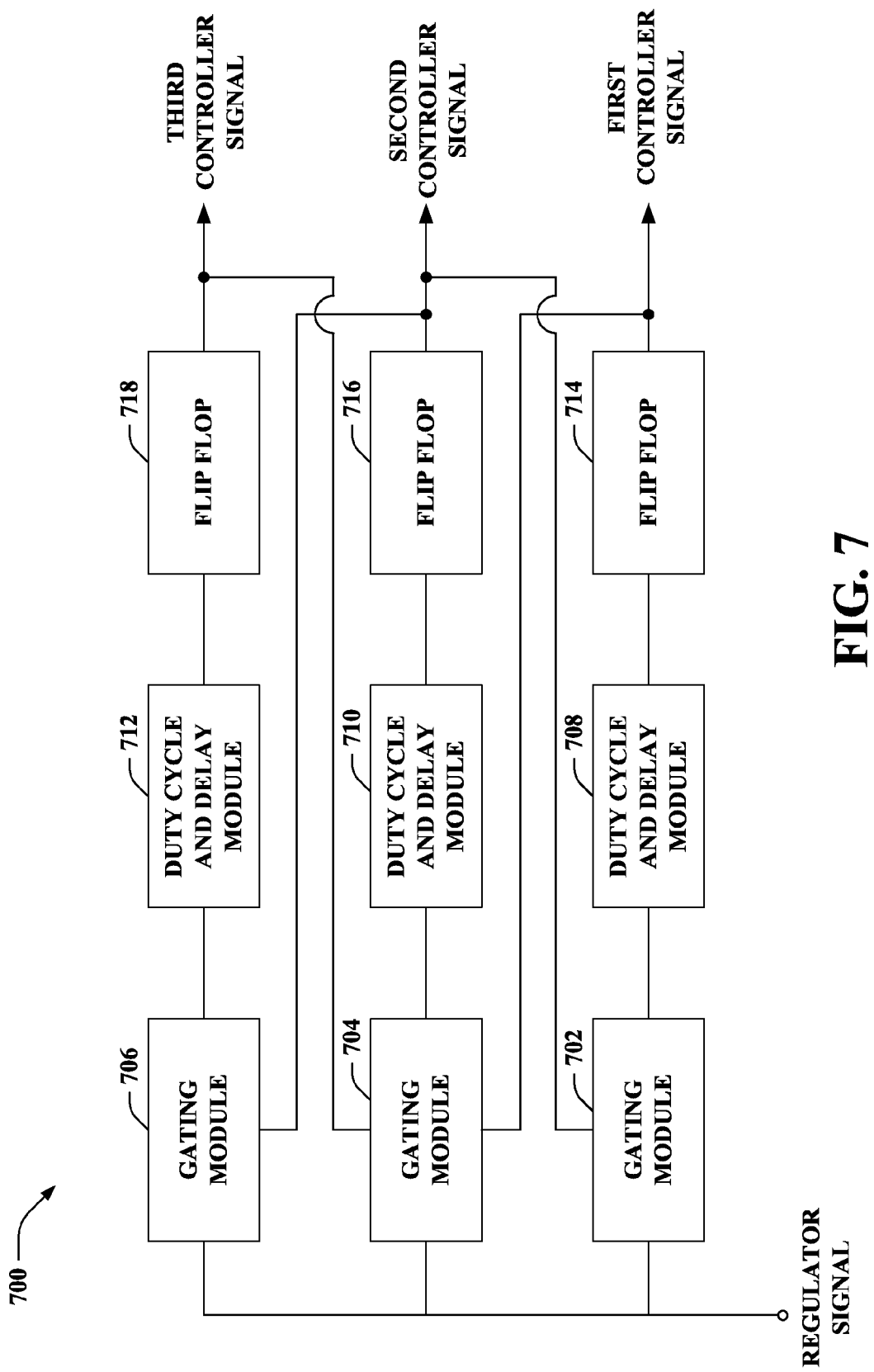
FIG. 7 illustrates a schematic diagram of an exemplary thermometer controller of a self-scaled voltage booster.

Turning to FIG. 7, illustrated is an exemplary thermometer controller 700 (e.g., the controller 110) of a self-scaled voltage booster. It is to be appreciated that the thermometer controller 700 is provided as an example, and other configurations are intended to fall within the scope of the hereto appended claims. The thermometer controller 700 can receive a regulator signal from a regulator (e.g., the regulator 108 of FIG. 1). Moreover, the thermometer controller 700 can generate a first controller signal (e.g., for the weak charge pump 602 of FIG. 6), a second controller signal (e.g., for the medium charge pump 604 of FIG. 6), and a third controller signal (e.g., for the strong charge pump 606 of FIG. 6).

The thermometer controller 700 includes three gating modules (a gating module 702, a gating module 704, and a gating module 706, collectively referred to as gating modules 702-706), three duty cycle and delay modules (a duty cycle and delay module 708, a duty cycle and delay module 710, and a duty cycle and delay module 712, collectively referred to as duty cycle and delay modules 708-712), and three flip flops (a flip flop 714, a flip flop 716, and a flip flop 718, collectively referred to as flip flops 714-718). By way of example, the flip flops 714-718 can be R/S flip flops; however, it is to be appreciated that the claimed subject matter is not so limited (e.g., the flip flops 714-718 can be replaced by an up-down counter, etc.).

The duty cycle and delay modules 708-712 can detect a duty cycle of the regulator signal. Further, the gating modules 702-706 can respectively control whether the regulator signal is provided to the duty cycle and delay modules 708-712. Moreover, the set of flip flops 714-718 can be a thermometer counter. Thus, the flip flops 714-718 can act as memory to hold present values of a thermometer code, where such present values correspond to whether the first controller signal, the second controller signal, and the third controller signal enable or disable the weak charge pump 602, the medium charge pump 604, and the strong charge pump 606, respectively.

The following provides an illustration of operation of the thermometer controller 700; yet, it is to be appreciated that the claimed subject matter is not limited to such illustration. The weak charge pump 602, the medium charge pump 604, and the strong charge pump 606 can initially be disabled by the first controller signal, the second controller signal, and the third controller signal, respectively. Hence, the flip flops 714-718 can each be reset (e.g., zeros). Since the flip flops 714-718 are each reset, the gating module 702 can allow the regulator signal to pass to the duty cycle and delay module 708, while the gating module 704 can inhibit the regulator signal from passing to the duty cycle and delay module 710 and the gating module 706 can inhibit the regulator signal from passing to the duty cycle and delay module 712. Thereafter, a load on the output node 102 can increase (e.g., the load capacitance $C_{load}$ can increase with a fixed voltage distribution level), which can result in an increase in duty cycle of the regulator signal. The duty cycle and delay module 708 can detect that the duty cycle of the regulator signal is above a duty cycle threshold, which can cause the flip flop 714 to be set (e.g., one). Moreover, the first controller signal provided to the weak charge pump 602 can be modified to enable the weak charge pump 602. Thereafter, since the flip flop 714 is set, the gating module 704 can allow the regulator signal to pass to the duty cycle and delay module 710, and so forth.

Accordingly, a flip flop from the flip flops 714-718 can be set if the duty cycle of the regulator signal exceeds a duty cycle threshold (e.g., as determined by a corresponding duty cycle and delay module from the duty cycle and delay modules 708-712) and an adjacent flip flop below the flip flop is already set (e.g., the flip flop 716 can only be set if the flip flop 714 is already set, etc.). Likewise, a flip flop from the flip flops 714-718 can be reset if the duty cycle of the regulator signal is below a duty cycle threshold (e.g., as determined by a corresponding duty cycle and delay module from the duty cycle and delay modules 708-712) and an adjacent flip flop above the flip flop is already reset (e.g., the flip flop 716 can only be reset if the flip flop 718 is already reset, etc.).

By way of example, a duty cycle threshold to set a flip flop can be substantially similar to a duty cycle threshold to reset a flip flop (e.g., a duty cycle threshold used by the duty cycle and delay module 708 to set the flip flop 714 can be substantially similar to a duty cycle threshold used by the duty cycle and delay module 708 to reset the flip flop 714, etc.). Pursuant to another example, a duty cycle threshold to set a flip flop can differ from a duty cycle threshold to reset a flip flop (e.g., a duty cycle threshold used by the duty cycle and delay module 708 to set the flip flop 714 can differ from a duty cycle threshold used by the duty cycle and delay module 708 to reset the flip flop 714, etc.). Moreover, it is contemplated that the duty cycle threshold(s) used by the duty cycle and delay modules 708-712 can be substantially similar or can differ (e.g., the duty cycle and delay module 708 and the duty cycle and delay module 710 can use substantially similar or different duty cycle threshold(s), etc.).

Moreover, the duty cycle and delay modules 708-712 can have delay(s), which can mitigate race-through and give the system (e.g., self-scaled voltage booster, system on chip, etc.) a chance to settle after each code increment or decrement. After each increment or decrement of the flip flops 714-718, which causes the first controller signal, second controller signal, or third controller signal to be modified, the duty cycle and delay modules 708-712 can inhibit a subsequent increment or decrement of the flip flops 714-718 for a predetermined minimum period of time. Accordingly, modification of the first controller signal, the second controller signal, and the third controller signal can be inhibited for the predetermined minimum period of time after a prior modification of at least one of such controller signals.

By way of example, the predetermined minimum period of time can be substantially similar for the duty cycle and delay modules 708-712. According to another example, the predetermined minimum period of time can differ between at least a subset of the duty cycle and delay modules 708-712.

It is contemplated that the predetermined minimum period of time(s) can enable the system to settle, which can depend on parameters such as minimum loading capacitance, length of time for bleeder resistor(s) to ramp down through a target voltage range, size of the target voltage range, etc. According to an example, the predetermined minimum period of time(s) can be at least a few clock cycles (e.g., 5-20 clock cycles, etc.). However, it is to be appreciated that the claimed subject matter is not so limited.

Figure 8:
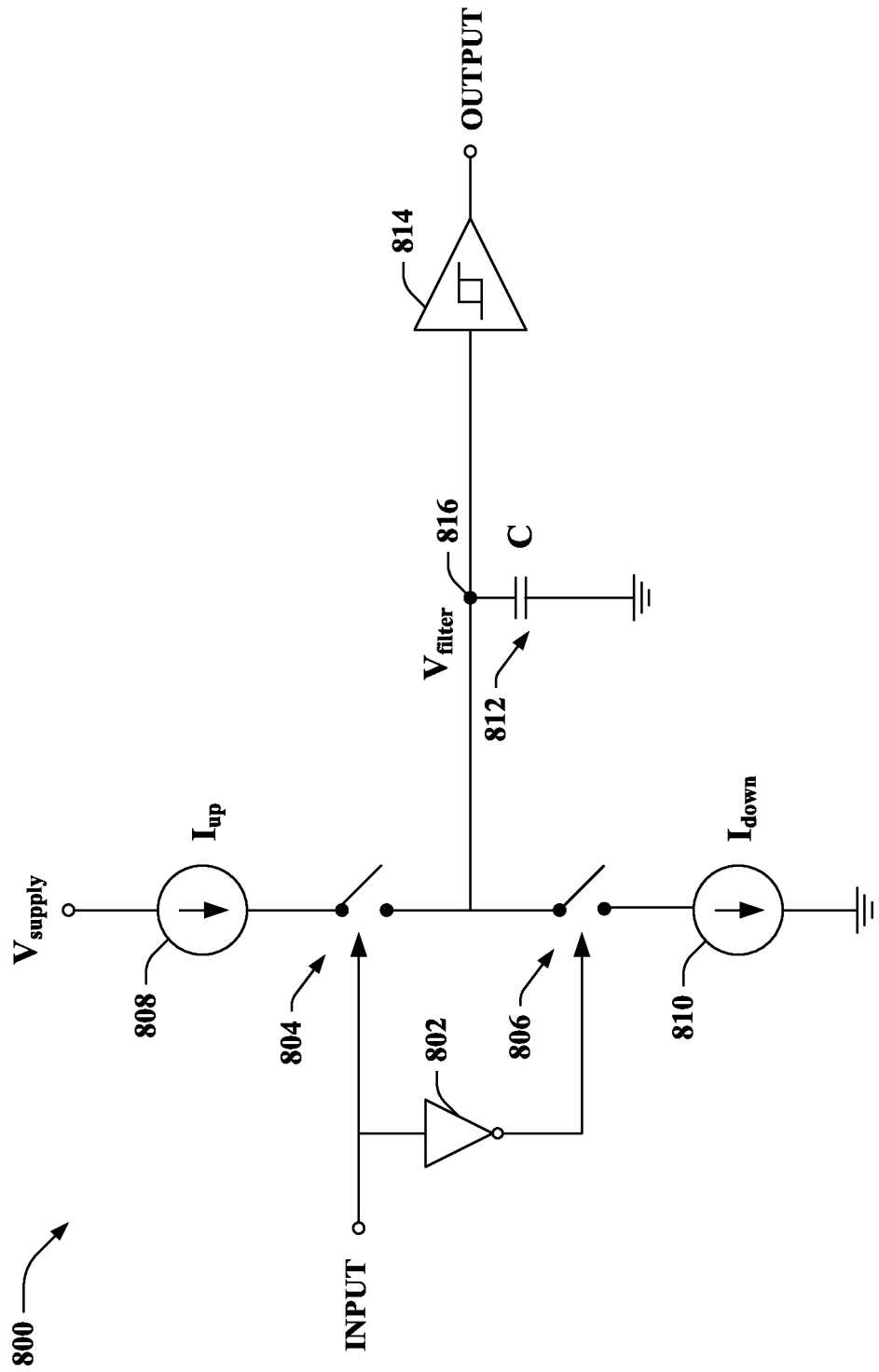
FIG. 8 illustrates a schematic diagram of an exemplary duty cycle and delay module of a controller.

With reference to FIG. 8, illustrated is an exemplary duty cycle and delay module 800 (e.g., one of the duty cycle and delay modules 708-712) of a controller. A pulse train signal (e.g., input) can be inputted to the duty cycle and delay module 800 (e.g., the input can be the output from a corresponding one of the gating modules 702-706, the input can be a gated input based on a regulator signal from a regulator, etc.); the pulse train signal can switch between a high state and a low state. The duty cycle and delay module 800 can determine whether a duty cycle of the pulse train signal is above or below a duty cycle threshold while also providing a delay.

The pulse train signal can be provided to a NOT gate 802. When the pulse train signal is at the high state, a switch 804 can be closed and a switch 806 can be opened. Alternatively, when the pulse train signal is at the low state, the switch 806 can be closed and the switch 804 can be opened.

Moreover, the duty cycle and delay module 800 includes a sourcing current source $I_{up}$ 808 (e.g., from $V_{supply}$) and a sinking current source $I_{down}$ 810 (e.g., to ground). The switch 804 is between the sourcing current source $I_{up}$ 808 and a filter node 816, and the switch 806 is between the sinking current source $I_{down}$ 810 and the filter node 816. Moreover, the duty cycle and delay module 800 also includes a capacitor 812 coupled with the filter node 816 and a Schmitt trigger 814 coupled with the filter node 816. The filter node 816 has a filter voltage $V_{filter}$.

When the pulse train signal is at the high state, the switch 804 is closed, which causes the sourcing current source $I_{up}$ 808 to be connected with the filter node 816, thereby increasing the filter voltage $V_{filter}$. Alternatively, when the pulse train signal is at the low state, the switch 806 is closed, which causes the sinking current source $I_{down}$ 810 to be connected with the filter node 816, thereby decreasing the filter voltage $V_{filter}$.

The Schmitt trigger 814 is a threshold circuit that generates an output (e.g., the output can be provided to a flip flop, used to generate a controller signal, etc.). The output retains its value until the filter voltage $V_{filter}$ changes sufficiently to trigger a change.

Moreover, a ratio between a first current of the sourcing current source $I_{up}$ 808 and a second current of the sinking current source $I_{down}$ 810 can control a duty cycle threshold of the duty cycle and delay module 800. For example, if the first current and the second current are the same, then the duty cycle threshold is 50%. By way of another example, if the first current if four times larger than the second current, then the duty cycle threshold is 20%. It is to be appreciated, however, that the claimed subject matter is not limited to the foregoing examples.

Further, the duty cycle and delay module 800 can provide inherent filtering and delay, especially if the input has been at one rail for a period of time (e.g., due to the gating modules 702-706). For example, the filter voltage $V_{filter}$ may start at ground (e.g., if a gating module has inhibited passing the regulator signal to the duty cycle and delay module 800). Following this example, if the regulator signal is thereafter permitted to pass to the duty cycle and delay module 800, and such signal has a duty cycle of 90%, it will take a period of time for the filter voltage $V_{filter}$ to ramp up and reach an upper threshold of the Schmitt trigger 814.

The delay (e.g., the predetermined minimum period of time) provided by the duty cycle and delay module 800 can be a function of the capacitor 812, the supply voltage $V_{supply}$, as well as absolute values of the first current of the sourcing current source $I_{up}$ 808 and the second current of the sinking current source $I_{down}$ 810. For example, the delay can be set to a number of times a minimum inherent delay required for duty cycle detection at a given minimum frequency or maximum half-cycle periods.

Figure 9:
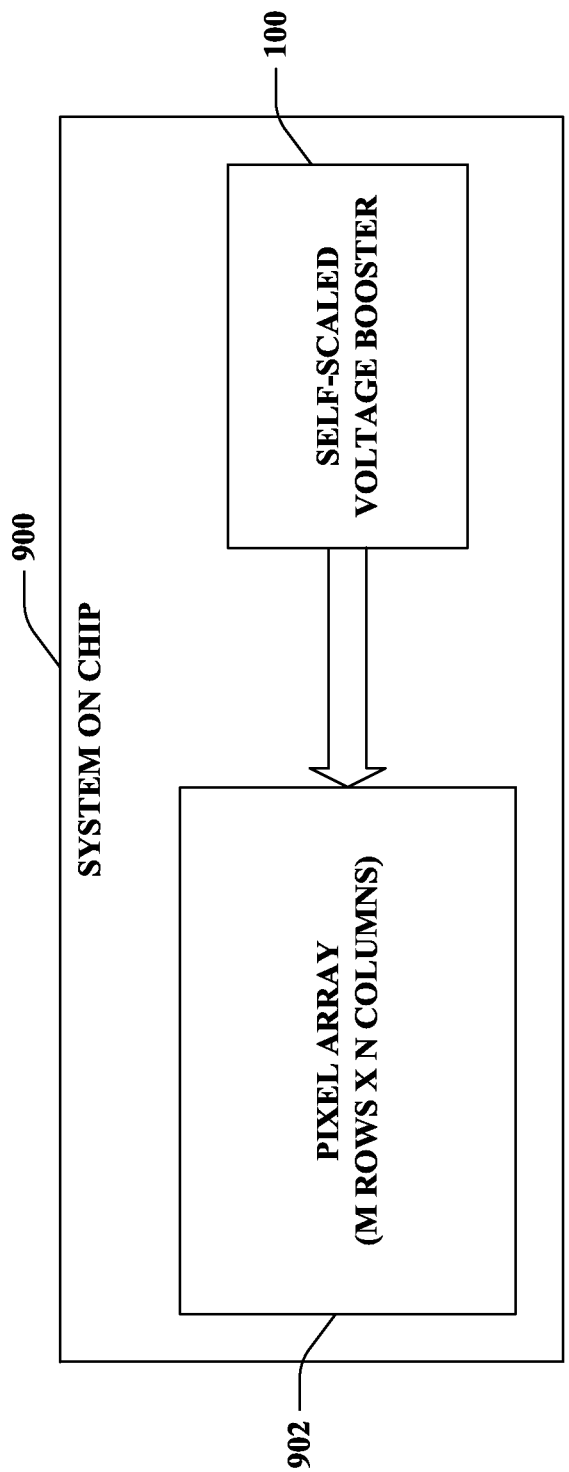
FIG. 9 illustrates a schematic diagram of an exemplary system on chip.

Turning to FIG. 9, illustrated is an exemplary system on chip 900. The system on chip 900 can be a CMOS image sensor system on chip. According to an example, a digital camera, a video camera (e.g., videoconference camera, broadcast video camera, cinematography camera, surveillance video camera, handheld video camera, camera integrated into a mobile phone, etc.), a video system, a medical imaging device (e.g., video laryngoscope, etc.), an industrial imaging device, a microscope, or the like can include the system on chip 900.

The system on chip 900 includes the self-scaled voltage booster 100 and a pixel array 902. The self-scaled voltage booster 100 can provide an output voltage $V_{out}$ at an output node (e.g., the output node 102) to at least a subset of pixels in the pixel array 902.

The pixel array 902 can include M rows and N columns of pixels, where M and N can be any integers. Each pixel in the pixel array 902 can comprise a photodetector (e.g., photogate, photoconductor, photodiode, etc.) that overlays a substrate to generate a photo-generated charge. Each pixel can also include a source follower transistor and a floating diffusion region connected to a gate of the source follower transistor. Accordingly, charge generated by the photodetector can be sent to the floating diffusion region. Further, each pixel can include a transistor for transferring charge from the photodetector to the floating diffusion region and another transistor for resetting the floating diffusion region to a predetermined charge level prior to charge transference; yet, it is to be appreciated that the claimed subject matter is not so limited.

Output from a pixel included in a particular column of the pixel array 902 can be provided to a voltage amplifier (not shown) corresponding to the particular column. The voltage amplifier can amplify analog video information (e.g., a signal) read out from the pixel in the particular column as well as other pixels in the particular column. Analog video information yielded from each pixel is oftentimes memorized into a sampling capacitor (not shown) at an output of the voltage amplifier corresponding to the column.

Figure 10:
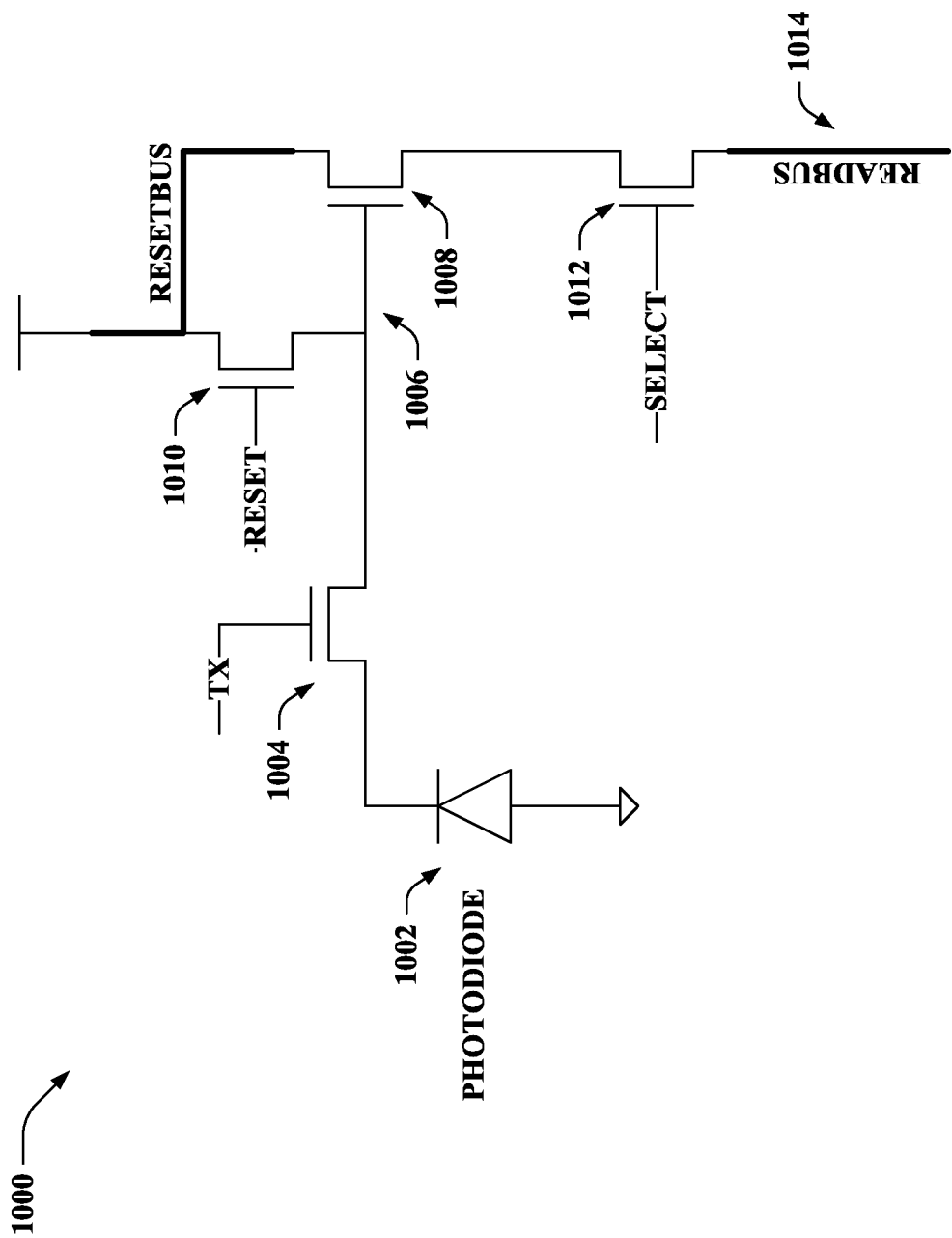
FIG. 10 illustrates a schematic diagram of an exemplary CMOS image sensor pixel that can be included in a pixel array.

Now turning to FIG. 10, illustrated is an exemplary CMOS image sensor pixel cell 1000 that can be included in a pixel array (e.g., the pixel array 902 of FIG. 9). The pixel 1000 as depicted is a 4T pixel cell utilized in a CMOS image sensor system on chip (e.g., the system on chip 900 of FIG. 9). The pixel 1000 includes a photodiode 1002 connected to a transfer transistor 1004. The transfer transistor 1004 is further connected to a floating diffusion region 1006. The floating diffusion region 1006 connects to a source follower transistor 1008 and a reset transistor 1010. The source follower transistor 1008 is further connected to a select transistor 1012. The select transistor 1012 can be employed to select a particular row of pixel cells from a pixel array. For instance, a select signal can be received at a gate of the select transistor 1012 to read out a value from the floating diffusion region 1006.

The photodiode 1002 can be charged by converting optical energy to electrical energy. For instance, the photodiode 1002 can have sensitivity to a particular type of incident light (e.g., red light, blue light, green light). Yet, it is to be appreciated that the claimed subject matter is not so limited.

According to an illustration, the floating diffusion region 1006 can be reset to a known state before transfer of charge to it. Resetting of the floating diffusion region 1006 can be effectuated by the reset transistor 1010. For example, a reset signal can be received at a gate of the reset transistor 1010 to cause resetting of the floating diffusion region 1006. Further, the transfer transistor 1004 can transfer charge (e.g., provided by the photodiode 1002) to the floating diffusion region 1006. The charge can be transferred based upon a transfer signal (TX) received at a gate of the transfer transistor 1004. Light can be integrated at the photodiode 1002 and electrons generated from the light can be transferred to the floating diffusion region 1006 (e.g., in a noiseless or substantially noiseless manner) when the TX is received at the transfer transistor 1004. Moreover, the pixel 1000 (along with other pixel(s) in the same row of the pixel array) can be selected for readout by employing the select transistor 1012. Readout can be effectuated via a read bus 1014. Further, the source follower transistor 1008 can output and/or amplify a signal representing a reset voltage (e.g., provided via a reset bus) and a pixel signal voltage based on the photo converted charges.

It is to be appreciated, however, that different pixel configurations other than the example illustrated in FIG. 10 are intended to fall within the scope of the hereto appended claims. For instance, a disparate pixel configuration can lack the transfer gate transistor 1004 (e.g., a 3T pixel). According to another illustration, a differing pixel configuration can include more than four transistors. Yet, it is to be appreciated that the claimed subject matter is not limited to the aforementioned examples.

Figure 11:
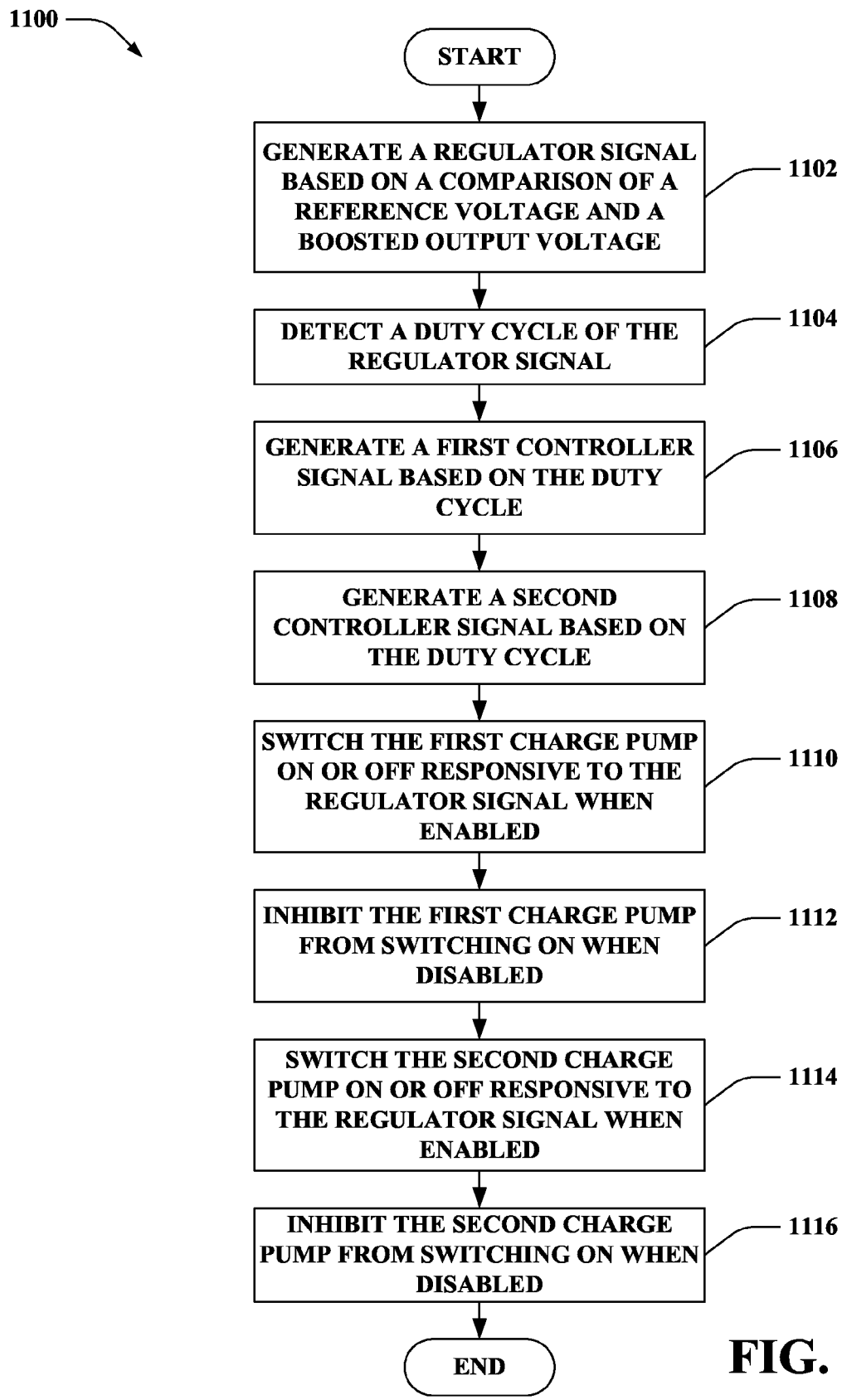
FIG. 11 is a flow diagram that illustrates an exemplary methodology of generating a boosted output voltage on a CMOS image sensor.

FIG. 11 illustrates an exemplary methodology relating to generating a boosted output voltage on a CMOS image sensor. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodology can be stored in a computer-readable medium, displayed on a display device, and/or the like.

FIG. 11 illustrates a methodology 1100 of generating a boosted output voltage on a CMOS image sensor. At 1102, a regulator signal can be generated based on a comparison of a reference voltage and the boosted output voltage. At 1104, a duty cycle of the regulator signal can be detected. For example, the duty cycle of the regulator signal can be compared to duty cycle threshold(s). At 1106, a first controller signal that selectively enables and disables a first charge pump can be generated based on the duty cycle of the regulator signal. At 1108, a second controller signal that selectively enables and disables a second charge pump can be generated based on the duty cycle of the regulator signal. At 1110, the first charge pump can be switched on or off responsive to the regulator signal when the first charge pump is enabled by the first controller signal. At 1112, the first charge pump can be inhibited from switching on when the first charge pump is disabled by the first controller signal. At 1114, the second charge pump can be switched on or off responsive to the regulator signal when the second charge pump is enabled by the second controller signal. At 1116, the second charge pump can be inhibited from switching on when the second charge pump is disabled by the second controller signal.

According to an example, the second charge pump can be selectively enabled and disabled based on the duty cycle of the regulator signal only when the first charge pump is enabled. Following this example, the second charge pump can be disabled when the first charge pump is enabled.

By way of another example, the first charge pump can be selectively enabled and disabled based on the duty cycle of the regulator signal only when the second charge pump is disabled. Pursuant to this example, the first charge pump can be enabled when the second charge pump is enabled.

Figure 12:
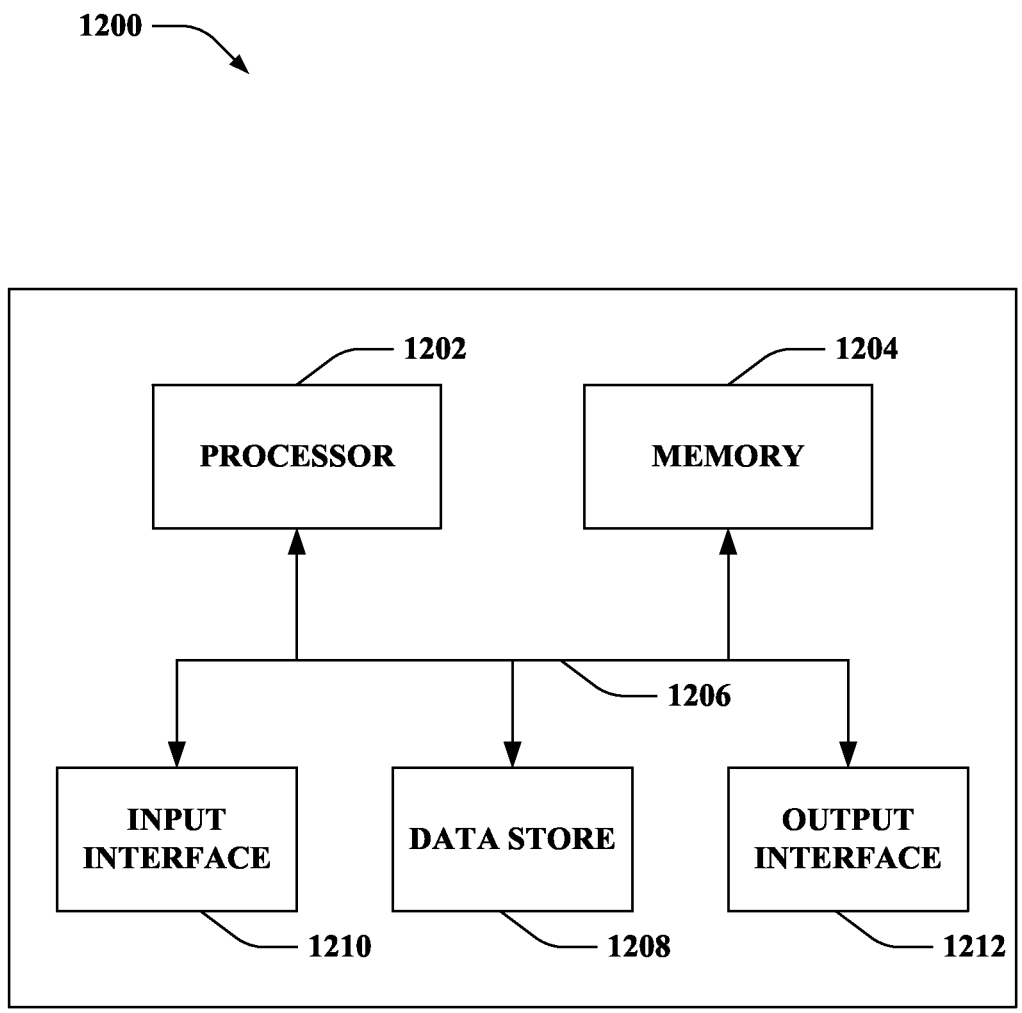
FIG. 12 illustrates an exemplary computing device.

Referring now to FIG. 12, a high-level illustration of an exemplary computing device 1200 that can be used in accordance with the systems and methodologies disclosed herein is illustrated. For instance, the computing device 1200 may employ a CMOS image sensor system on chip. According to another, one or more components of the computing device 1200 can be integrated in a CMOS image sensor system on chip. The computing device 1200 includes at least one processor 1202 that executes instructions that are stored in a memory 1204. The processor 1202 may access the memory 1204 by way of a system bus 1206.

The computing device 1200 additionally includes a data store 1208 that is accessible by the processor 1202 by way of the system bus 1206. The data store 1208 may include executable instructions, etc. The computing device 1200 also includes an input interface 1210 that allows external devices to communicate with the computing device 1200. For instance, the input interface 1210 may be used to receive instructions from an external computer device, from a user, etc. The computing device 1200 also includes an output interface 1212 that interfaces the computing device 1200 with one or more external devices. For example, the computing device 1200 may display text, images, etc. by way of the output interface 1212.

Additionally, while illustrated as a single system, it is to be understood that the computing device 1200 may be a distributed system. Thus, for instance, several devices may be in communication by way of a network connection and may collectively perform tasks described as being performed by the computing device 1200.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices.

Further, as used herein, the term "exemplary" is intended to mean "serving as an illustration or example of something."

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A self-scaled voltage booster of an imaging system on chip, the self-scaled voltage booster includes an output node, the self-scaled voltage booster comprising:
a first charge pump that comprises a first input terminal and a first output terminal, wherein the first output terminal is coupled with the output node;
a second charge pump that comprises a second input terminal and a second output terminal, wherein the second output terminal is coupled with the output node;
a regulator that comprises a third input terminal and a third output terminal, wherein the third input terminal is coupled with the output node, and wherein the regulator is configured to generate a regulator signal; and
a controller configured to generate a first controller signal provided to the first charge pump and a second controller signal provided to the second charge pump, the controller further comprises:
a fourth input terminal coupled with the third output terminal of the regulator;
a fourth output terminal coupled with the first input terminal of the first charge pump;
a fifth output terminal coupled with the second input terminal of the second charge pump; and
a duty cycle and delay module configured to manage the first controller signal and the second controller signal based on a duty cycle of the regulator signal, wherein the duty cycle and delay module is further configured to maintain the first controller signal and the second controller signal without modification for at least a predetermined minimum period of time.

2. The self-scaled voltage booster of claim 1, further comprising a third charge pump that comprises a fifth input terminal and a sixth output terminal, wherein the sixth output terminal is coupled with the output node, and wherein the controller is further configured to generate a third controller signal provided to the third charge pump.

3. The self-scaled voltage booster of claim 1, wherein the regulator is a bang-bang regulator.

4. The self-scaled voltage booster of claim 1, wherein the first charge pump and the second charge pump have differing strengths.

5. The self-scaled voltage booster of claim 1, wherein the controller is a thermometer controller.

6. The self-scaled voltage booster of claim 1, wherein the controller is configured to selectively enable and disable the first charge pump and the second charge pump respectively with the first controller signal and the second controller signal.

7. The self-scaled voltage booster of claim 6, wherein the controller is configured to selectively enable and disable the second charge pump only when the first charge pump is enabled, and otherwise the second charge pump is disabled when the first charge pump is disabled.

8. The self-scaled voltage booster of claim 6, wherein the controller is configured to selectively enable and disable the first charge pump only when the second charge pump is disabled, and otherwise the first charge pump is enabled when the second charge pump is enabled.

9. The self-scaled voltage booster of claim 6, wherein the first charge pump is configured to switch on or off based on the regulator signal when enabled and remain off when disabled, and the second charge pump is configured to switch on or off based on the regulator signal when enabled and remain off when disabled.

10. The self-scaled voltage booster of claim 1, further comprising an auxiliary charge pump that comprises a seventh output terminal that is coupled with the output node, and wherein the auxiliary charge pump is configured to switch on or off based on the regulator signal.

11. The self-scaled voltage booster of claim 1, wherein the first charge pump comprises a first bleeder resistor and the second charge pump comprises a second bleeder resistor, wherein a resistance of the first bleeder resistor differs from a resistance of the second bleeder resistor.

12. The self-scaled voltage booster of claim 1, wherein the duty cycle and delay module comprises:
a sourcing current source;
a sinking current source,
a capacitor coupled with a filter node;
a first switch between the sourcing current source and the filter node;
a second switch between the sinking current source and the filter node; and
a Schmitt trigger coupled with the filter node,
wherein the first switch is configured to connect the sourcing current source to the filter node and the second switch is configured to disconnect the sinking current source from the filter node when a gated input based on the regulator signal is at a high state, and wherein the first switch is configured to disconnect the sourcing current source from the filter node and the second switch is configured to connect the sinking current source to the filter node when the gated input based on the regulator signal is at a low state.

13. The self-scaled voltage booster of claim 12, wherein a ratio between a first current of the sourcing current source and a second current of the sinking current source controls a duty cycle threshold of the duty cycle and delay module.

14. The self-scaled voltage booster of claim 1, wherein the controller further comprises a first flip flop and a second flip flop that hold present values of a thermometer code, wherein the present values correspond to whether the first controller signal one of enables or disables the first charge pump and whether the second controller signal one of enables or disables the second charge pump.

15. The self-scaled voltage booster of claim 1, wherein an output voltage is supplied at the output node, and wherein the output voltage is one of greater than a supply voltage or less than ground.

16. A system on chip, comprising:
a pixel array that includes a set of pixels; and
a self-scaled voltage booster that provides a boosted output voltage at an output node to at least a subset of the pixels in the pixel array, wherein the self-scaled voltage booster comprises:
a weak charge pump coupled with the output node;
a medium charge pump coupled with the output node;
a strong charge pump coupled with the output node;
a regulator configured to generate a regulator signal based on a comparison of a reference voltage and the boosted output voltage at the output node; and
a controller configured to generate a first controller signal that selectively enables and disables the weak charge pump, a second controller signal that selectively enables and disables the medium charge pump, and a third controller signal that selectively enables and disables the strong charge pump based at least in part on a duty cycle of the regulator signal,
wherein the controller is further configured to inhibit modification of the first controller signal, the second controller signal, and the third controller signal for a predetermined minimum period of time after a prior modification of at least one of the first controller signal, the second controller signal, or the third controller signal, and
wherein the weak charge pump, the medium charge pump, and the strong charge pump are configured to switch on or off responsive to the regulator signal when respectively enabled and are configured to remain off when respectively disabled.

17. The system on chip of claim 16, wherein at least one of a digital camera or a video camera comprises the system on chip.

18. The system on chip of claim 16, wherein the controller further comprises a duty cycle and delay module.

19. The system on chip of claim 16, wherein the controller further comprises a plurality of duty cycle and delay modules.

20. The system of chip of claim 19, wherein the controller further comprises a plurality of flip flops respectively corresponding with the plurality of duty cycle and delay modules.

21. The system on chip of claim 20, wherein one of the plurality of flip flops is set if the duty cycle of the regulator signal exceeds a duty cycle threshold as determined by a corresponding one of the plurality of duty cycle and delay modules and a flip flop from the plurality of flip flops that is adjacent and below is set.

22. The system on chip of claim 20, wherein one of the plurality of flip flops is reset if the duty cycle of the regulator signal is below a duty cycle threshold as determined by a corresponding one of the plurality of duty cycle and delay modules and a flip flop from the plurality of flip flops that is adjacent and above is reset.

23. The system on chip of claim 16, wherein the system on chip is a complementary metal-oxide-semiconductor (CMOS) image sensor system on chip.

24. A method of generating a boosted output voltage on a complementary metal-oxide-semiconductor (CMOS) image sensor, comprising:

generating a regulator signal based on a comparison of a reference voltage and the boosted output voltage;
detecting a duty cycle of the regulator signal;
generating a first controller signal that selectively enables and disables a first charge pump based on the duty cycle of the regulator signal;
generating a second controller signal that selectively enables and disables a second charge pump based on the duty cycle of the regulator signal;
switching the first charge pump one of on or off responsive to the regulator signal when the first charge pump is enabled by the first controller signal;
inhibiting the first charge pump from switching on when the first charge pump is disabled by the first controller signal;
switching the second charge pump one of on or off responsive to the regulator signal when the second charge pump is enabled by the second controller signal; and
inhibiting the second charge pump from switching on when the second charge pump is disabled by the second controller signal.

25. The method of claim 24, further comprising:
selectively enabling and disabling the second charge pump based on the duty cycle of the regulator signal only when the first charge pump is enabled; and
disabling the second charge pump when the first charge pump is disabled.

26. The method of claim 24, further comprising:
selectively enabling and disabling the first charge pump based on the duty cycle of the regulator signal only when the second charge pump is disabled; and
enabling the first charge pump when the second charge pump is enabled.

* * * * *